US012593548B2

(12) United States Patent
Ahn

(10) Patent No.: US 12,593,548 B2
(45) Date of Patent: Mar. 31, 2026

(54) DISPLAY PANEL AND DISPLAY DEVICE

(71) Applicant: LG Display Co., Ltd., Seoul (KR)

(72) Inventor: Jiyoung Ahn, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 405 days.

(21) Appl. No.: 18/354,526

(22) Filed: Jul. 18, 2023

(65) Prior Publication Data

US 2024/0222578 A1     Jul. 4, 2024

(30) Foreign Application Priority Data

Dec. 30, 2022     (KR) ........................ 10-2022-0190604

(51) Int. Cl.
H10H 20/856     (2025.01)
H01L 25/075     (2006.01)
H01L 25/16     (2023.01)
H10D 86/40     (2025.01)
H10H 20/85     (2025.01)
H10H 29/14     (2025.01)

(52) U.S. Cl.
CPC ......... H10H 20/856 (2025.01); H01L 25/167 (2013.01)

(58) Field of Classification Search
CPC ............. H10H 20/856; H10H 20/8506; H10H 29/142; H01L 25/167; H10D 86/441
See application file for complete search history.

(56) References Cited

U.S. PATENT DOCUMENTS

2018/0122836 A1*   5/2018   Kang ................. H10H 20/8514
2022/0149017 A1    5/2022   Hwang et al.

FOREIGN PATENT DOCUMENTS

KR    10-2020-0038839 A    4/2020
KR    10-2021-0035556 A    4/2021

* cited by examiner

*Primary Examiner* — Antonio B Crite
(74) *Attorney, Agent, or Firm* — Seed Intellectual Property Law Group LLP

(57)                ABSTRACT

Disclosed are a display panel and a display device in which one reflective plate has different areas with different light reflectance, such that an average reflectance of the reflective plate is lowered, while a light-emitting element is positioned in an area corresponding to a relatively high reflectance area, so that black reflection visibility can be improved while light efficiency and light reflectance can be optimized. The display panel includes a substrate; a reflective plate disposed on the substrate; and a light-emitting element disposed on the reflective plate, wherein the reflective plate includes a first reflective area and a second reflective area, wherein the first reflective area has a reflectance of light of a wavelength of 550 nm greater than a reflectance of light of a wavelength of 550 nm of the second reflective area, wherein at least a partial area of the light-emitting element overlaps the first reflective area.

20 Claims, 15 Drawing Sheets

DISPLAY PANEL AND DISPLAY DEVICE

CROSS-REFERENCE TO RELATED APPLICATION

This application claims priority from Korean Patent Application No. 10-2022-0190604 filed on Dec. 30, 2022, in the Korean Intellectual Property Office, and all the benefits accruing therefrom under 35 U.S.C. 119, the contents of which in its entirety are herein incorporated by reference.

BACKGROUND

Technical Field

The present disclosure relates to a display panel and a display device, and more particularly, to a display panel and a display device including a micro-LED.

Description of the Related Art

A display device is implemented in very diverse forms such as televisions, monitors, smart phones, tablet PCs, laptops, and wearable devices.

For example, a display device using a micro-LED (light-emitting diode) with a microscopic size as a light-emitting element has high image quality and high reliability.

The micro-LED element is a semiconductor light-emitting element that emits light when current flows in a semiconductor, and has recently been widely used in various fields such as a lighting field as well as a display field.

A micro-LED display device may be manufactured by crystallizing micro-LED elements on a semiconductor (wafer) substrate, and then transferring the crystallized micro-LED elements to a separate substrate with a driving element.

BRIEF SUMMARY

The transferring of the micro-LED elements to the separate substrate may be performed in a transfer process of transferring the micro-LED elements to positions corresponding to pixels formed in the separate substrate.

The transfer process is a very sophisticated process because it is desirable to transfer each of the micro-LED elements to a location of each of the pixels already formed in the substrate as precisely as possible.

For example, in order to increase the light efficiency of the micro-LED element, a reflective plate having high reflectance that may reflect light from the micro-LED element as efficiently as possible may be disposed.

Therefore, when the micro-LED element is disposed on the reflective plate of the high reflectance, the light efficiency of the micro-LED element may be improved.

In this case, the reflective plate may be actually formed in an area larger than an area size of a light-emitting area including the micro-LED element in consideration of an alignment margin during the transfer process of the micro-LED elements.

However, when the reflective plate of the high reflectance is disposed in the larger area in this way, the light reflectance may be increased, while black reflection visibility may be deteriorated due to high light reflectance.

In particular, in a display device without a polarizer, the black reflection visibility may be further deteriorated due to the high light reflectance.

Accordingly, the inventors of the present disclosure conducted several experiments in order to obtain a display panel and a display device having optimized light efficiency and reflectance.

Through the various experiments, the inventors of the present disclosure have invented a display panel and a display device having optimized light efficiency and light reflectance while improving the black reflection visibility.

A technical purpose according to an embodiment of the present disclosure is to provide a display panel and a display device including a reflective plate structure having optimized light efficiency and light reflectance while improving black reflective visibility.

One or more embodiments of the present disclosure provide a display panel and a display device including a reflective plate structure having optimized light efficiency and light reflectance in consideration of a transfer alignment margin of the light-emitting element.

One or more embodiments of the present disclosure provide a display panel and a display device including a reflective plate structure having optimized light efficiency and uniform light reflectance in consideration of different light efficiencies of a plurality of sub-pixels rendering different colors.

One or more embodiments of the present disclosure provide a low-power display panel and a low-power display device.

One or more embodiments of the present disclosure provide a display panel and a display device having an eco-friendly part.

The technical benefits according to the present disclosure are not limited to the above-mentioned benefits. Other benefits and advantages according to the present disclosure that are not mentioned may be understood based on following descriptions, and may be more clearly understood based on embodiments according to the present disclosure. Further, it will be easily understood that the benefits and advantages according to the present disclosure may be realized using means shown in the claims or combinations thereof.

A display panel according to an embodiment of the present disclosure includes a substrate; a reflective plate disposed on the substrate; and a light-emitting element disposed on the reflective plate, wherein the reflective plate includes a first reflective area and a second reflective area, wherein the first reflective area has a reflectance of light of a wavelength of 550 nm greater than a reflectance of light of a wavelength of 550 nm of the second reflective area, wherein at least a partial area of the light-emitting element overlaps the first reflective area.

A display panel according to an embodiment of the present disclosure includes a substrate; a reflective plate disposed on the substrate; and a plurality of light-emitting elements disposed on the reflective plate, wherein the reflective plate includes a first reflective area and a second reflective area, wherein the first reflective area has a reflectance of light of a wavelength of 550 nm greater than a reflectance of light of a wavelength of 550 nm of the second reflective area, wherein some of the plurality of light-emitting elements are disposed so as to overlap the first reflective area, while the others of the plurality of light-emitting elements are disposed so as to overlap the second reflective area.

A display device according to an embodiment of the present disclosure includes a substrate; a thin-film transistor including a pair of source and drain electrodes; a reflective plate electrically connected to one of the source and drain electrodes; a light-emitting element disposed on the reflective plate; and a connection electrode electrically connecting the reflective plate and the light-emitting element to each other, wherein the reflective plate includes a first reflective area and a second reflective area, wherein the first reflective area has a reflectance of light of a wavelength of 550 nm greater than a reflectance of light of a wavelength of 550 nm of the second reflective area, wherein at least a partial area of the light-emitting element overlaps the first reflective area.

A display device according to an embodiment of the present disclosure includes a substrate; a thin-film transistor including a pair of source and drain electrodes; a reflective plate electrically connected to one of the source and drain electrodes; a plurality of light-emitting elements disposed on the reflective plate; and a connection electrode electrically connecting the reflective plate and the light-emitting element to each other, wherein the reflective plate includes a first reflective area and a second reflective area, wherein the first reflective area has a reflectance of light of a wavelength of 550 nm greater than a reflectance of light of a wavelength of 550 nm of the second reflective area, wherein some of the plurality of light-emitting elements are disposed so as to overlap the first reflective area, while the others of the plurality of light-emitting elements are disposed so as to overlap the second reflective area.

According to the embodiment of the present disclosure, one reflective plate includes areas having different reflectance such that the average reflectance of the reflective plate is lowered. In this regard, the light-emitting element is positioned in an area corresponding to a relatively high reflectance area, so that the black reflection visibility may be improved while light efficiency and light reflectance may be optimized.

In addition, according to the embodiment of the present disclosure, the average reflectance of the reflective plate may be lowered, while at least a partial area of the light-emitting element may be positioned in an area corresponding to the relatively high reflectance area of the reflective plate. Thus, the light efficiency and the light reflectance may be optimized in consideration of the transfer alignment margin of the light-emitting element.

In addition, according to the embodiment of the present disclosure, among a plurality of sub-pixels rendering different colors, a sub-pixel with high light efficiency may be disposed so as to correspond to the low reflectance area of the reflective plate, and a sub-pixel with low light efficiency may be disposed so as to correspond to the high reflectance area of the reflective plate. Thus, when the display device includes the plurality of sub-pixels having different light efficiencies, the light efficiency and the light reflectance may be optimized. Further, the difference between the light efficiencies of the light-emitting elements having different light efficiencies may be reduced due to the above-described arrangement structure of the low reflectance area and the high reflectance area of the reflective plate.

In addition, according to the embodiment of the present disclosure, the display panel and the display device with high light efficiency may be realized. Thus, a low-power display panel and display device may be realized to reduce power consumption.

In addition, according to an embodiment of the present disclosure, the display panel and the display device having the reflective plate including the low reflectance area may be provided. Thus, a Uni-material may be used to provide an eco-friendly part that may be recycled.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

DETAILED DESCRIPTIONS

Figure 1:
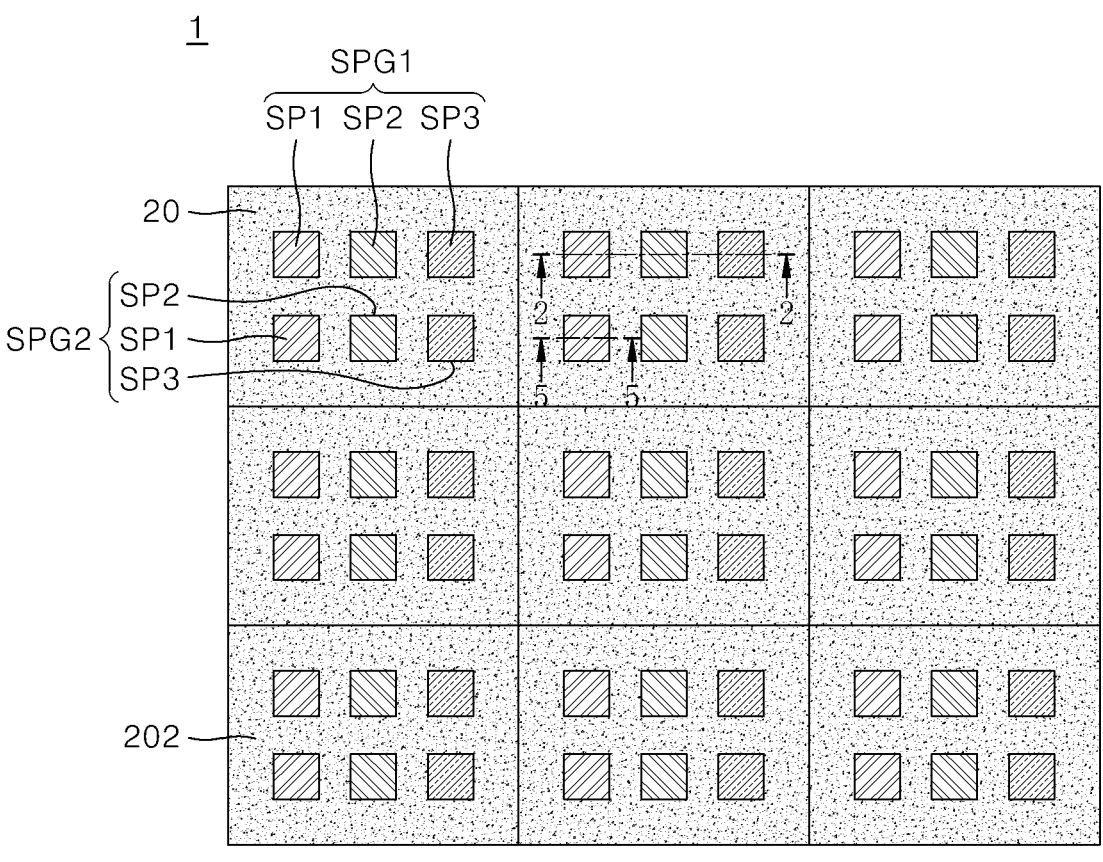
FIG. 1 is a plan view of a display device according to a first embodiment to a fifth embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents included within the spirit and scope of the present disclosure.

A shape, a size, a dimension (e.g., length, width, height, thickness, radius, diameter, area, etc.), a ratio, an angle, a number of elements, etc., disclosed in the drawings for describing embodiments of the present disclosure are illustrative, and the present disclosure is not limited thereto. The same reference numerals refer to the same elements herein.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

The terminology used herein is directed to the purpose of describing particular embodiments only and is not intended to be limiting of the present disclosure. It will be further understood that the terms "comprise," "including," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to." "before," etc., another event may occur therebetween unless "directly after," "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first." "second." "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments." "examples," "aspects," and the like should not be construed such that any aspect or design as described is superior to or advantageous over other aspects or designs.

Further, the term 'or' means 'inclusive or' rather than 'exclusive or.' That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, with reference to FIG. 1 to FIG. 11, a display panel and a display device according to the first embodiment to the fifth embodiment of the present disclosure will be described in detail.

Figure 2:
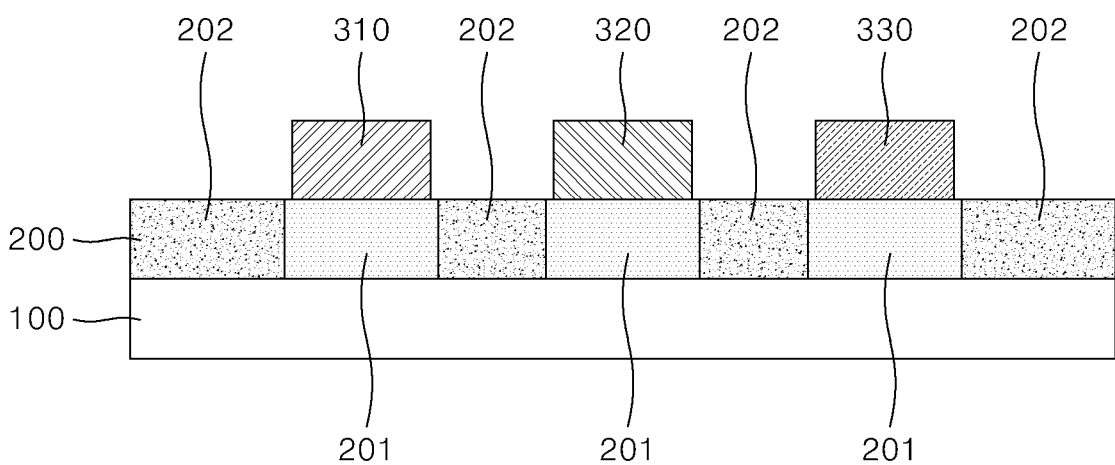
FIG. 2 is a cross-sectional view of a display device corresponding to one pixel according to a first embodiment to a fifth embodiment of the present disclosure.
Figure 3:
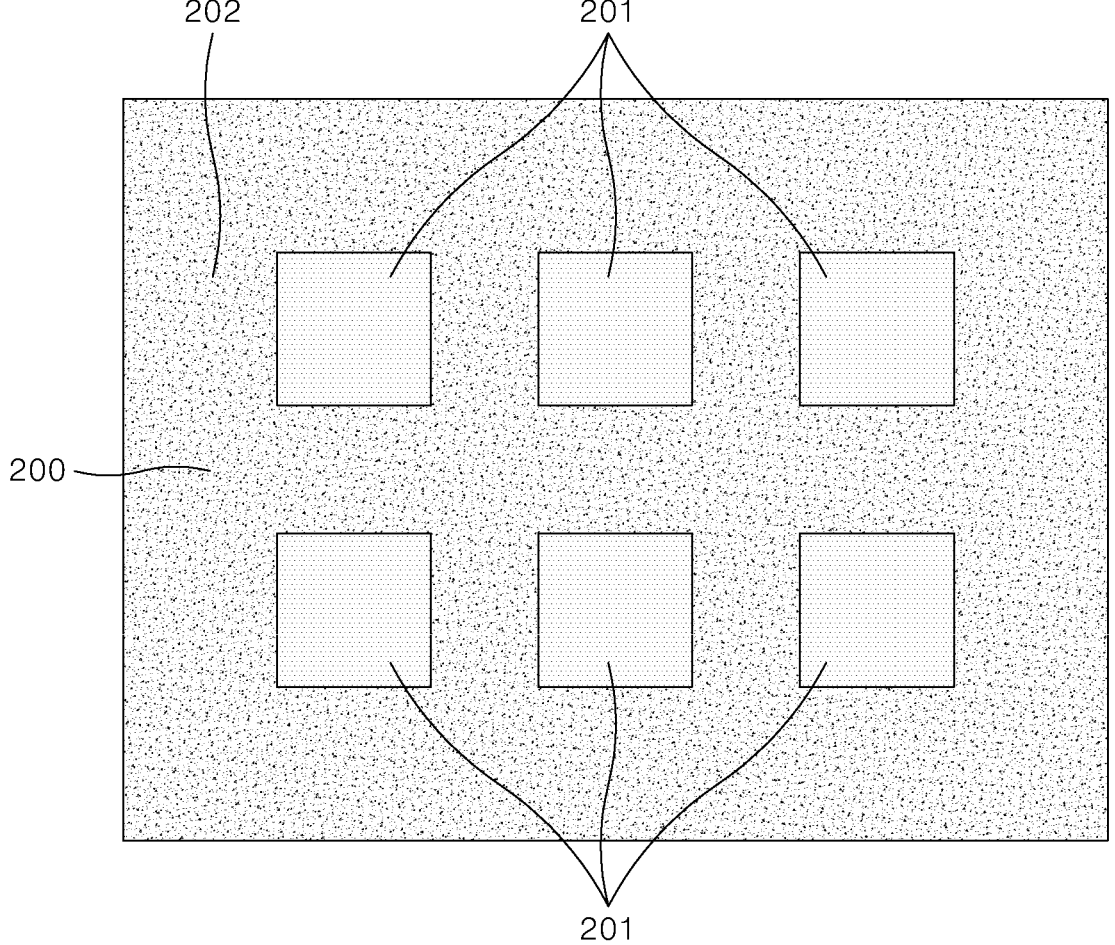
FIG. 3 is a plan view of a reflective plate corresponding to one pixel according to a first embodiment to a fifth embodiment of the present disclosure.

Referring to FIG. 1 to FIG. 3, a display device 1 may include a plurality of unit display panels 20.

A cross-sectional view taken along a line 2-2 as shown in FIG. 1 corresponds to FIG. 2, FIG. 4, FIG. 7, FIG. 8, and FIG. 10, and a cross-sectional view taken along a line 5-5 as shown in FIG. 1 corresponds to FIG. 5, FIG. 6, FIG. 9, and FIG. 11.

In the present disclosure, it is illustrated that the plurality of unit display panels 20 are collected to constitute the display device 1. However, the present disclosure is not limited thereto, and the plurality of unit display panels 20 are collected to constitute one display panel 20.

The display panel 20 may include a substrate 100 and a plurality of light-emitting elements 310, 320, and 330 mounted on the substrate 100.

The substrate 100 may be made of a transparent material such as glass. However, the present disclosure is not limited thereto.

The substrate 100 may be a thin-film transistor (TFT) array substrate.

Accordingly, a thin-film transistor and various lines for driving the light-emitting element 300 may be formed in a pixel area P on the substrate 100.

When the thin-film transistor is turned on, a driving signal input from an external source is applied to the light-emitting element 300 via the various lines so that the light-emitting element 300 emits light. Thus, an image may be displayed.

The unit display panel 20 may include a first sub-pixel group SPG1 and a second sub-pixel group SPG2 on the substrate 100. The first sub-pixel group SPG1 and the second sub-pixel group SPG2 may be grouped together to define one pixel P. However, the present disclosure is not limited thereto.

Each of the first sub-pixel group SPG1 and the second sub-pixel group SPG2 may include a first sub-pixel SP1, a second sub-pixel SP2, and a third sub-pixel SP3.

A plurality of light-emitting elements 300 disposed on the substrate 100 may include a first color light-emitting element 310, a second color light-emitting element 320, and a third color light-emitting element 330.

In this case, the first color light-emitting element 310 may render a red color (R), the second color light-emitting element 320 may render a green color (G), and the third color light-emitting element 330 may render a blue color (B).

The first color light-emitting element 310 may be transferred to a position corresponding to the first sub-pixel SP1. The second color light-emitting element 320 may be transferred to a position corresponding to the second sub-pixel SP2. The third color light-emitting element 330 may be transferred to a position corresponding to the third sub-pixel SP3.

The present disclosure describes an example in which the light-emitting element 300 is embodied as a micro-LED element. However, the present disclosure is not limited thereto.

For example, the light-emitting element 300 may be embodied as a micro-LED element having a size of about 10 to 100 μm.

The light-emitting elements 300 may be manufactured in a process separate from a thin-film transistor array process of the substrate 100.

The light-emitting elements 300 may be formed in a process of growing a plurality of thin-films made of an inorganic material on a sapphire substrate or a silicon substrate and then cutting and separating the sapphire substrate or the silicon substrate into a plurality of portions.

The plurality of light-emitting elements 300 thus formed may be transferred onto the substrate 100 of the display panel 20 and thus may be converted to the light-emitting elements 300 of the display panel 20.

A plurality of pixel P areas arranged in a matrix manner may be defined in the substrate 100 and may be defined by a plurality of gate lines and a plurality of data lines overlapping each other.

In this case, the gate line and the data line may be connected to the light-emitting element 300.

A gate pad and a data pad connected to an external source may be provided at ends of the gate line and the data line, respectively. Thus, an external signal is applied to the light-emitting element 300 via the gate line and the data line. The light-emitting element may operate to emit light.

A reflective plate 200 may be disposed on the substrate 100.

Specifically, the reflective plate 200 may be disposed between the substrate 100 and the light-emitting element 300, and the reflective plate 200 may be disposed under the light-emitting element 300.

When the reflective plate 200 is disposed under the light-emitting element 300, light emitted from the light-emitting element 300 may be reflected upwardly at a minimal loss.

The reflective plate 200 according to an embodiment of the present disclosure may include areas having different light reflectance.

Specifically, the reflective plate 200 includes a first reflective area 201 and a second reflective area 202, wherein reflectance of light of a wavelength of 550 nm of the first reflective area 201 may be higher than reflectance of light of a wavelength of 550 nm of the second reflective area 202.

Therefore, the first reflective area 201 may be a relatively higher reflectance area compared to the second reflective area 202. The second reflective area 202 may be a relatively lower reflectance area compared to the first reflective area 201.

Hereinafter, the light reflectance described in the present disclosure refers to light reflectance measured based on light having a wavelength of 550 nm.

The second reflective area 202 may be formed to cover an entire surface of the unit display panel 20. However, the present disclosure is not limited thereto, and the second reflective area 202 may be patterned in a corresponding manner to each of the sub-pixels SP formed in the unit display panel 20.

For example, the first reflective area 201 may be positioned in an area corresponding to each sub-pixel SP in the unit display panel 20, while the second reflective area 202 may be disposed in the remaining area except for the first reflective area 201.

Therefore, in the unit display panel 20, a plurality of first reflective areas 201 may be arranged. The first reflective areas 201 adjacent to each other may be arranged to be spaced apart from each other.

The second reflective area 202 may be disposed to surround the plurality of first reflective areas 201 arranged in the above-described manner.

Each of the light-emitting elements 300 disposed on the reflective plate 200 having the above arrangement structure of the first reflective areas 201 and the second reflective area 202 may have at least a partial area overlapping the first reflective area 201 corresponding to each sub-pixel SP.

More specifically, at least a partial area of the light-emitting element 300 may be disposed so as to overlap the first reflective area 201 in a vertical direction in a cross-sectional view according to an embodiment of the present disclosure.

It is beneficial that an entirety of an area of the light-emitting element 300 overlaps the first reflective area 201 disposed thereunder. However, in consideration of the alignment margin according to the transfer process, an area size of the first reflective area 201 may be larger than an area size of the lower surface of the light-emitting element 300.

In this way, the reflective plate 200 does not include only the high reflectance areas, but includes areas having different reflectance including the low reflectance area and the high reflectance area, so that an average reflectance of the reflective plate 200 may be reduced.

In this case, a total area size of the second reflective area 202 of the reflective plate 200 may be larger than a total area size of the first reflective areas 201.

In this manner, the total area size of the second reflective area 202 as the low reflectance area is larger than the total area size of the first reflective areas 201 as the high reflectance areas, such that the average reflectance of the reflective plate 200 may be further reduced.

Although the average reflectance of the reflective plate 200 according to an embodiment of the present disclosure is reduced, the high reflectance area is disposed in an area corresponding to the lower surface of the light-emitting element 300 which benefits from having a substantially high reflectance. Thus, very high light efficiency may be obtained.

That is, according to an embodiment of the present disclosure, the black reflective visibility may be improved due to the reflective plate 200 having the reduced average reflectance, while the light-emitting element 300 may have high light efficiency and high light reflectance.

In addition, according to an embodiment of the present disclosure, the average reflectance of the reflective plate 200 may be lowered, while at least a partial area of the light-emitting element 300 may be positioned in an area corresponding to the relatively high reflectance area of the reflective plate 200. Thus, in consideration of the transfer alignment margin of the light-emitting element 300, the light efficiency and the light reflectance may be optimized.

Hereinafter, various embodiments of the reflective plate 200 according to an embodiment of the present disclosure will be described in more detail.

Figure 4:
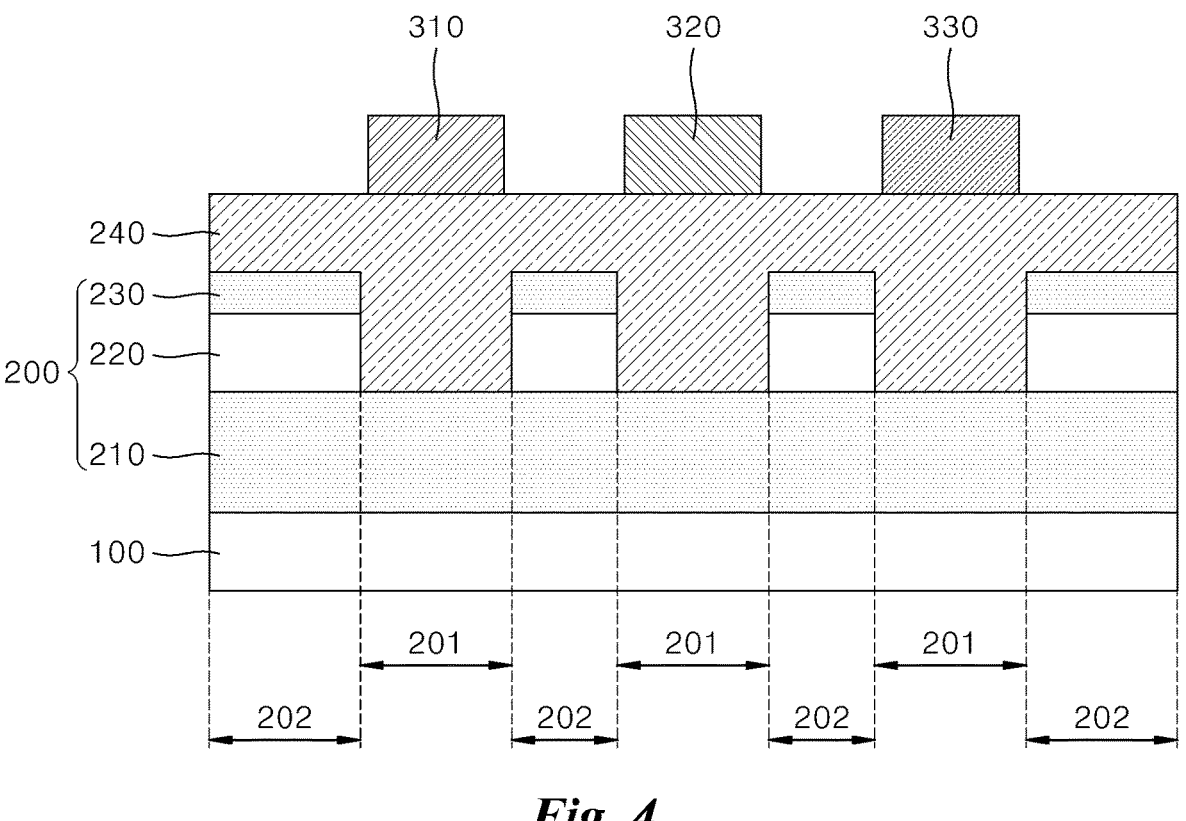
FIG. 4 is a cross-sectional view of a display device corresponding to one pixel according to a first embodiment and a second embodiment of the present disclosure.
Figure 5:
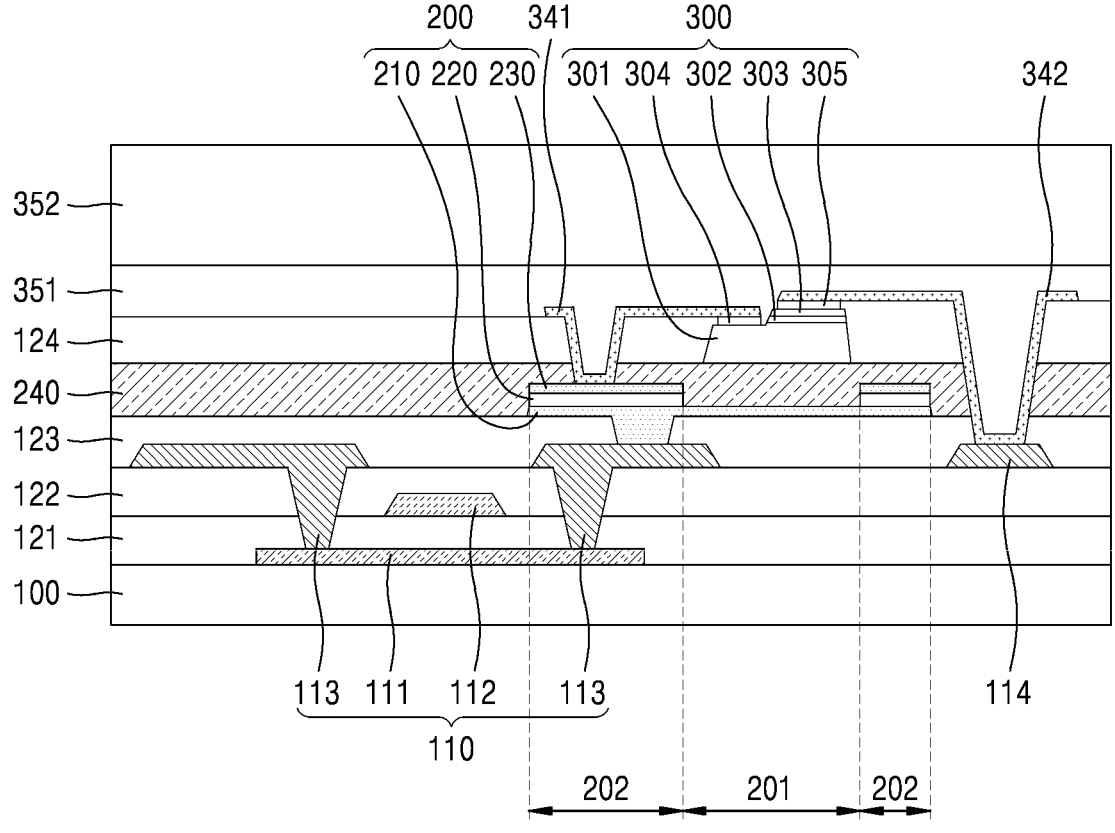
FIG. 5 is a cross-sectional view of a display device corresponding to one sub-pixel according to a first embodiment of the present disclosure.

Referring to FIG. 4 and FIG. 5, the reflective plate 200 according to a first embodiment may include a first reflective plate layer 210 disposed so as to correspond to the first reflective area 201 and the second reflective area 202, and a second reflective plate layer 220 and a third reflective plate layer 230 sequentially stacked on the first reflective plate layer 210 and disposed so as to correspond to the second reflective area 202.

As such, the reflective plate 200 may be composed of one layer in the first reflective area 201 and may be composed of three layers in the second reflective area 202.

Each of the first reflective plate layer 210 and the third reflective plate layer 230 may be a metal layer.

The metal layer may include one or more materials selected from aluminum (Al), silver (Ag), molybdenum (Mo), and titanium (Ti), or may include an alloy of two or more thereof. In other words, the metal layer may include at least one selected from a group consisting of aluminum (Al), silver (Ag), molybdenum (Mo), titanium (Ti), and an alloy of at least two thereof. However, the present disclosure is not limited thereto.

For example, when a metal layer is made of a metal having a light reflectance of 60% at a wavelength of 550 nm, or when a metal layer is made of a metal having a light reflectance of 60% and a light transmittance of 30% or greater at a wavelength of 500 nm, the metal layer may be used as each of the first reflective plate layer 210 and the third reflective plate layer 230.

The first reflective plate layer 210 and the third reflective plate layer 230 may have different thicknesses.

For example, the thickness of the third reflective plate layer 230 may be smaller than the thickness of the first reflective plate layer 210. The third reflective plate layer 230 may be formed in a form of a very thin metal thin-film compared to the first reflective plate layer 210.

When the third reflective plate layer 230 is thinner than the first reflective plate layer 210, a portion of the light emitted from the light-emitting element 300 and then directed to the reflective plate 200 may pass through the third reflective plate layer 230. However, a substantial amount of the light emitted from the light-emitting element 300 and then directed to the reflective plate 200 may be reflected from the first reflective plate layer 210 having a relatively larger thickness and then may travel upwardly.

In this way, the thickness of each of the first reflective plate layer 210 and the third reflective plate layer 230 may be adjusted such that the high and low reflectance areas may be easily implemented in a separate manner.

The second reflective plate layer 220 may be a transparent layer.

The transparent layer may be a conductive oxide layer or a transparent insulating layer.

For example, the conductive oxide layer may be made of indium-tin-oxide (ITO), indium-zinc-oxide (IZO), or indium-gallium-zinc-oxide (IGZO). The transparent insulating layer may be made of $SiO_x$, $SiN_x$, $SiO_2$, SiON, or the like.

In the reflective plate 200 as described above, an area where only the first reflective plate layer 210 is disposed may be the first reflective area 201 corresponding to the high reflectance area, while an area where the first reflective plate layer 210, the second reflective plate layer 220, and the third reflective plate layer 230 are stacked may be the second reflective area 202 corresponding to the low reflectance area.

Figure 18:
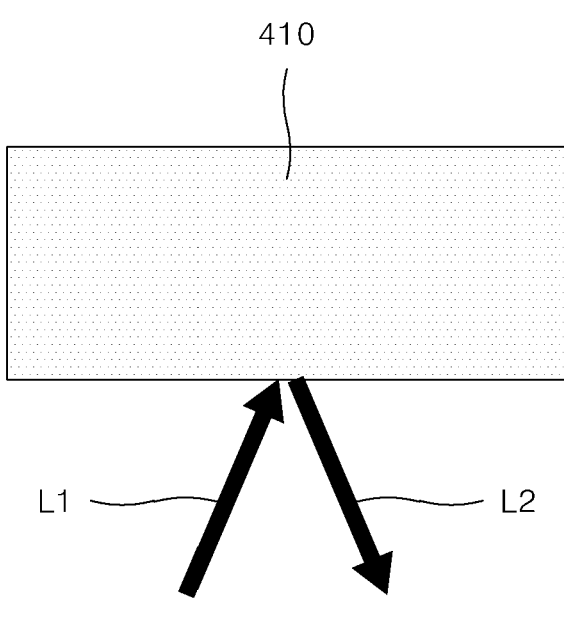
FIG. 18 shows that light is reflected from one reflective plate layer at a high reflectance.
Figure 19:
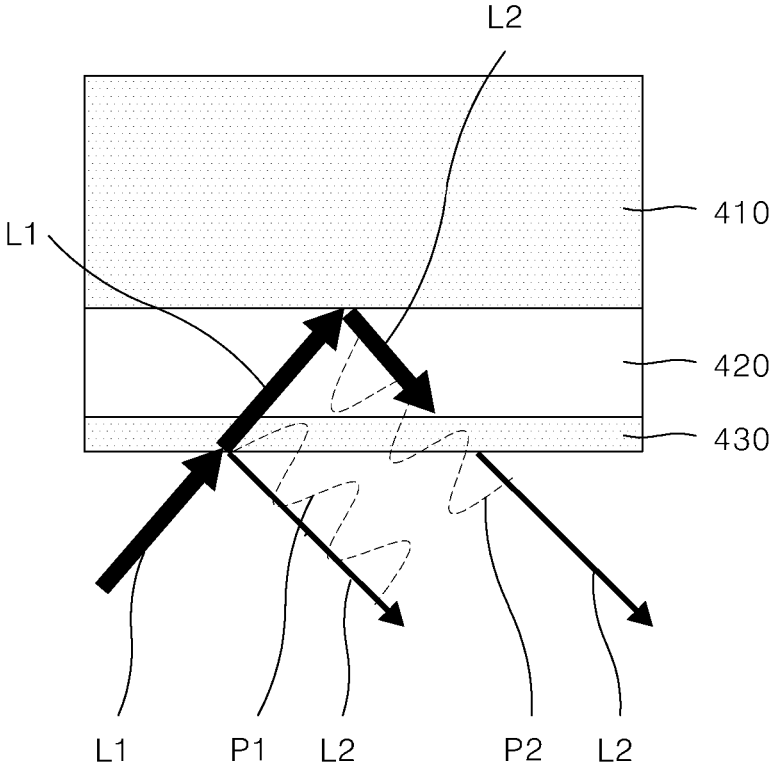
FIG. 19 shows that light is reflected from a triple-layers reflective plate according to an embodiment of the present disclosure at a low reflectance.

The light reflectance of the reflective plate 200 having such a structure may be described with referring to FIG. 18 and FIG. 19.

FIG. 18 is an experiment of reflectance of a single metal layer based on incident light L1 and reflected light L2.

In this case, a first layer 410 is embodied as a single layer made of aluminum (Al) and having a thickness of 2000 Å.

The incident light L1 having a wavelength of 550 nm is incident on the first layer 410 as a single layer, and then, the reflected light L2 is measured. As a result, light reflectance of about 70% or greater is measured.

FIG. 19 is an experiment of reflectance of a reflective plate having a stack structure of three layers in which a third layer 430, a second layer 420, and the first layer 410 as a top layer are sequentially stacked based on incident light L1 and reflected light L2.

In this case, the third layer 430 is embodied as an aluminum (Al) layer having a thickness of 100 Å to 200 Å. The second layer 420 is embodied as an ITO layer having a thickness of 550 Å to 900 Å. The first layer 410 is embodied as an aluminum (Al) layer with a thickness of 2000 Å.

When the incident light L1 having a wavelength of 550 nm is incident on a reflective plate having the stack of the three layers, partial light is reflected from a surface of the third layer 430, while partial light passes through the third layer 430 and the second layer 420 and is reflected from an interface between the first layer 410 and the second layer 420 and then passes through the third layer 430 again and returns downwardly out of the stack.

In this case, the reflected light beams L2 which are reflected from the first layer 410 and the third layer 430, respectively may be generated, and may be out of phases by 180 degrees.

Therefore, as the two reflected light beams L2 are out of phases by 180 degrees, destructive interference therebetween occurs, so that actually reflected light is greatly reduced.

In this way, the incident light L1 having a wavelength of 550 nm is incident on the reflective plate composed of the three layers, and then, the reflected light L2 is measured. As a result, light reflectance of about 10% or lower is measured.

Through the above experimental examples, it may be identified that an area of the reflective plate 200 in which the stack of the three layers is disposed according to an embodiment of the present disclosure may act as the low-reflectance area.

Referring to FIG. 5, a cross-sectional structure corresponding to one sub-pixel SP according to the first embodiment will be described in detail.

A thin-film transistor 110 may be disposed on the substrate 100.

Specifically, an active layer 111 may be disposed on the substrate 100. A first insulating layer 121 may be disposed on the active layer 111. A gate electrode layer 112 may be disposed on the first insulating layer 121.

A second insulating layer 122 may be disposed on the gate electrode layer 112.

A pair of source and drain electrodes 113 electrically connected to the active layer 111 respectively via a pair of contact-holes formed in the first insulating layer 121 and the second insulating layer 122 may be disposed on the second insulating layer 122.

The pair of source and drain electrodes 113 may include a source electrode and a drain electrode. One of the source/drain electrodes 113 electrically connected to the light-emitting element 300 may be the drain electrode.

In addition, a common line 114 may be disposed on the second insulating layer 122. The common line 114 may apply a high-potential voltage EVDD to the light-emitting element 300.

A third insulating layer 123 may be disposed on the pair of source and drain electrodes 113 and the common line 114.

The reflective plate 200 may be disposed on the third insulating layer 123.

The reflective plate 200 may be electrically connected to one of the source and drain electrodes 113, for example, the drain electrode via a contact-hole formed in the third insulating layer 123.

In this case, the second reflective plate layer 220 may be a conductive oxide layer. Accordingly, an area in which the first reflective plate layer 210, the second reflective plate layer 220, and the third reflective plate layer 230 are stacked may be an area in which the electric current flows through the three layers.

As described above, the reflective plate 200 may have a pattern including the first reflective area 201 in which the first reflective plate layer 210 is disposed, and the second reflective area 202 in which the first reflective plate layer 210, the second reflective plate layer 220, and the third reflective plate layer 230 are sequentially stacked.

A fixing layer 240 may be disposed on the reflective plate 200.

The fixing layer 240 may be embodied as an adhesive layer including a material having an adhesive component to serve to adhesively fix the transferred light-emitting element 300 to the substrate. The material is not particularly limited.

The light-emitting element 300 may be disposed on the fixing layer 240 and may be fixed thereto.

The light-emitting element 300 may be disposed so as to overlap the first reflective area 201 of the reflective plate 200 disposed thereunder in a vertical direction.

An example in which the light-emitting element 300 is embodied as a micro-LED element will be described.

The light-emitting element 300 may include a light-emissive layer having a stack structure in which a first semiconductor layer 301, a first active layer 302, and a second semiconductor layer 303 are sequentially stacked, and a first electrode 304 and a second electrode 305 disposed on an upper surface of the light-emissive layer, and electrically connected thereto.

In this case, the first electrode 304 may be an n-type electrode, and the second electrode 305 may be a p-type electrode.

The light-emissive layer may emit light via recombination of electrons and holes based on current flowing between the first electrode 304 and the second electrode 305.

The first semiconductor layer 301 may provide electrons to the first active layer 302.

The first active layer 302 may be disposed on one side of the first semiconductor layer 301.

The first active layer 302 may include a multi-quantum well (MQW) structure having a well layer and a barrier layer having a higher band gap than that of the well layer.

The second semiconductor layer 303 may be disposed on the first active layer 302 so as to provide holes to the first active layer 302.

The second electrode 305 may be disposed on the second semiconductor layer 303. The second electrode 305 may act as a cathode electrode providing electrons to the second semiconductor layer 303.

The first electrode 304 may be disposed on the other side of the first semiconductor layer 301 so as to be electrically isolated from the first active layer 302 and the second semiconductor layer 303. The first electrode 304 may act as an anode electrode providing holes to the first semiconductor layer 301.

A fourth insulating layer 124 may be disposed on the fixing layer 240 and the light-emitting element 300.

On the fourth insulating layer 124, a first connection electrode 341 may be disposed. The first connection electrode 341 may electrically connect the light-emitting element 300 and the reflective plate 200 to each other, for example, the first electrode 304 of the light-emitting element 300 and the reflective plate 200 to each other via a contact-hole formed in the fourth insulating layer 124 and the fixing layer 240.

In addition, on the fourth insulating layer 124, a second connection electrode 342 may be disposed. The second connection electrode 342 may electrically connect the second electrode 305 of the light-emitting element 300 and the common line 114 to each other via a contact-hole formed in the fourth insulating layer 124, the fixing layer 240, and the third insulating layer 123.

A first protection layer 351 and a second protection layer 352 protecting the light-emitting element 300 may be sequentially formed on the first connection electrode 341 and the second connection electrode 342.

In this case, each of the first protection layer 351 and the second protection layer 352 may include an organic material layer or an inorganic material layer, or a stack of a plurality of organic material layers and inorganic material layers.

Figure 6:
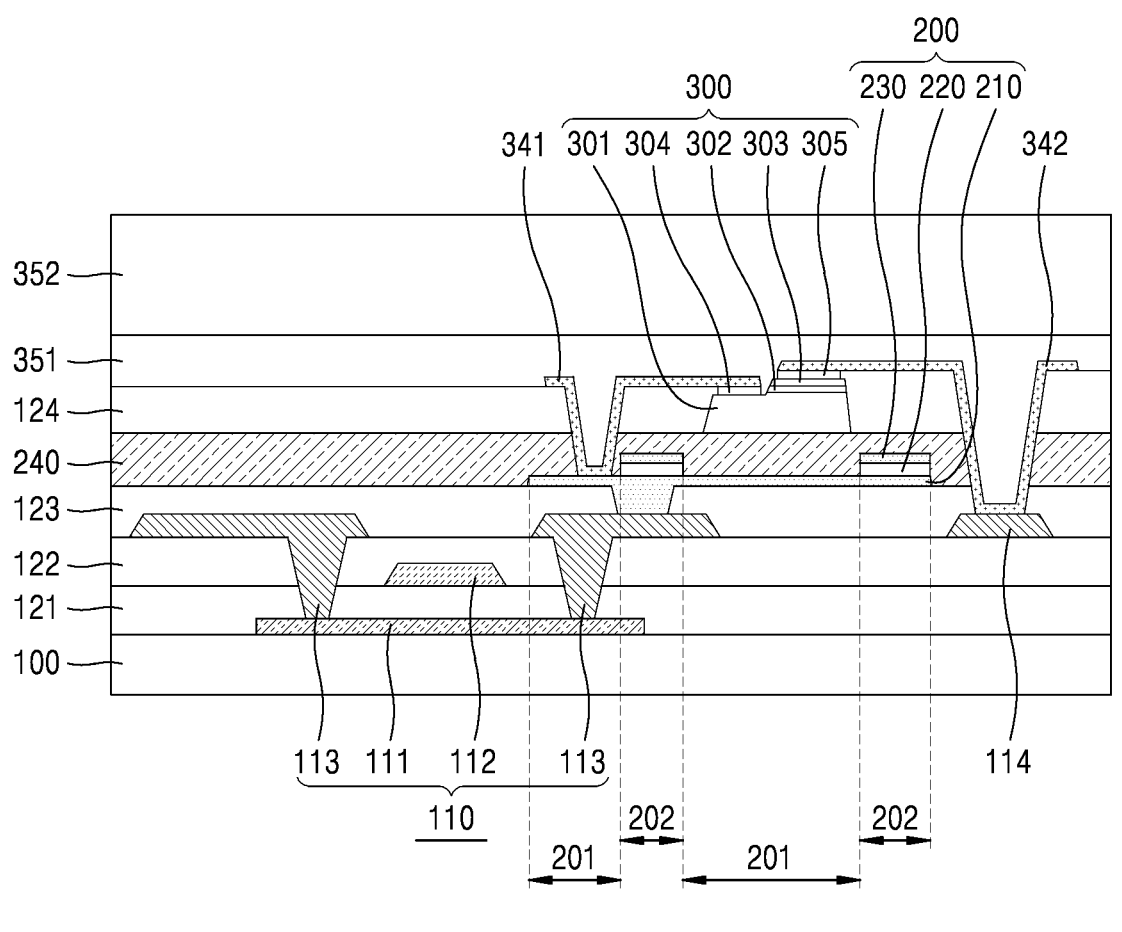
FIG. 6 is a cross-sectional view of a display device corresponding to one sub-pixel according to a second embodiment of the present disclosure.

A second embodiment may be described with reference to FIG. 6.

In additional embodiments including the second embodiment as described below, those duplicate with the descriptions of the first embodiment as set forth above will be omitted, and following descriptions will be based on differences therebetween.

The second embodiment is different from the first embodiment in terms of a connection structure between the reflective plate 200 and the first connection electrode 341.

In the second embodiment, the second reflective plate layer 220 included in the reflective plate 200 is a transparent insulating layer.

When the second reflective plate layer 220 as the transparent insulating layer is disposed between the first reflective plate layer 210 as the metal layer and the third reflective plate layer 230 as the metal layer, the electricity may not be conducted in the area where the first reflective plate layer 210, the second reflective plate layer 220, and the third reflective plate layer 230 are stacked.

Therefore, in the second embodiment, the reflective plate 200 may be patterned so that the first reflective area 201 composed only of the first reflective plate layer 210 includes not only an area of the reflective plate 200 overlapping the light-emitting element 300, but also an area of the reflective plate 200 in contact with the first connection electrode 341 such that the reflective plate 200 is electrically connected to the first connection electrode 341.

That is, in the second embodiment, only the first reflective plate layer 210 of the reflective plate 200 may be disposed in an area where a contact-hole is defined in the fixing layer 240 formed on the reflective plate 200, and in the fourth insulating layer 124.

Accordingly, the first connection electrode 341 may contact and be electrically connected to an upper surface of the first reflective plate layer 210.

Figure 7:
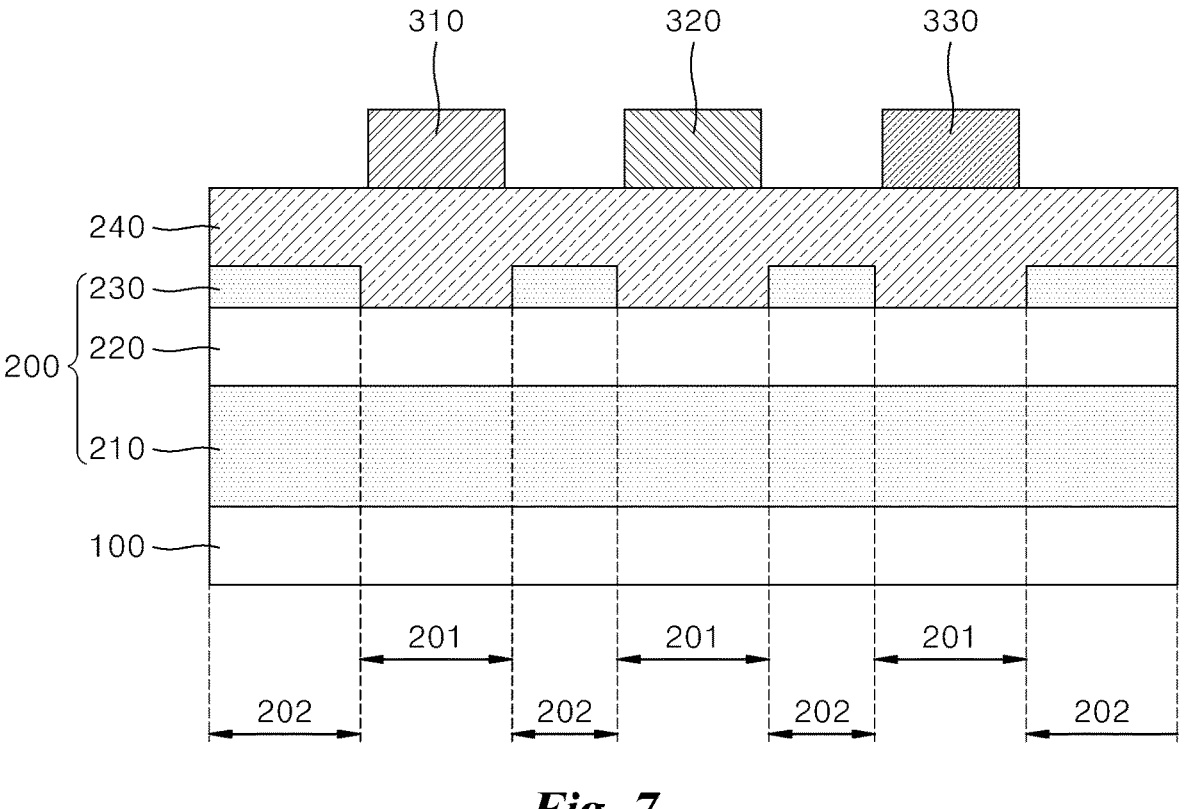
FIG. 7 is a cross-sectional view of a display device corresponding to one pixel according to a third embodiment of the present disclosure.
Figure 8:
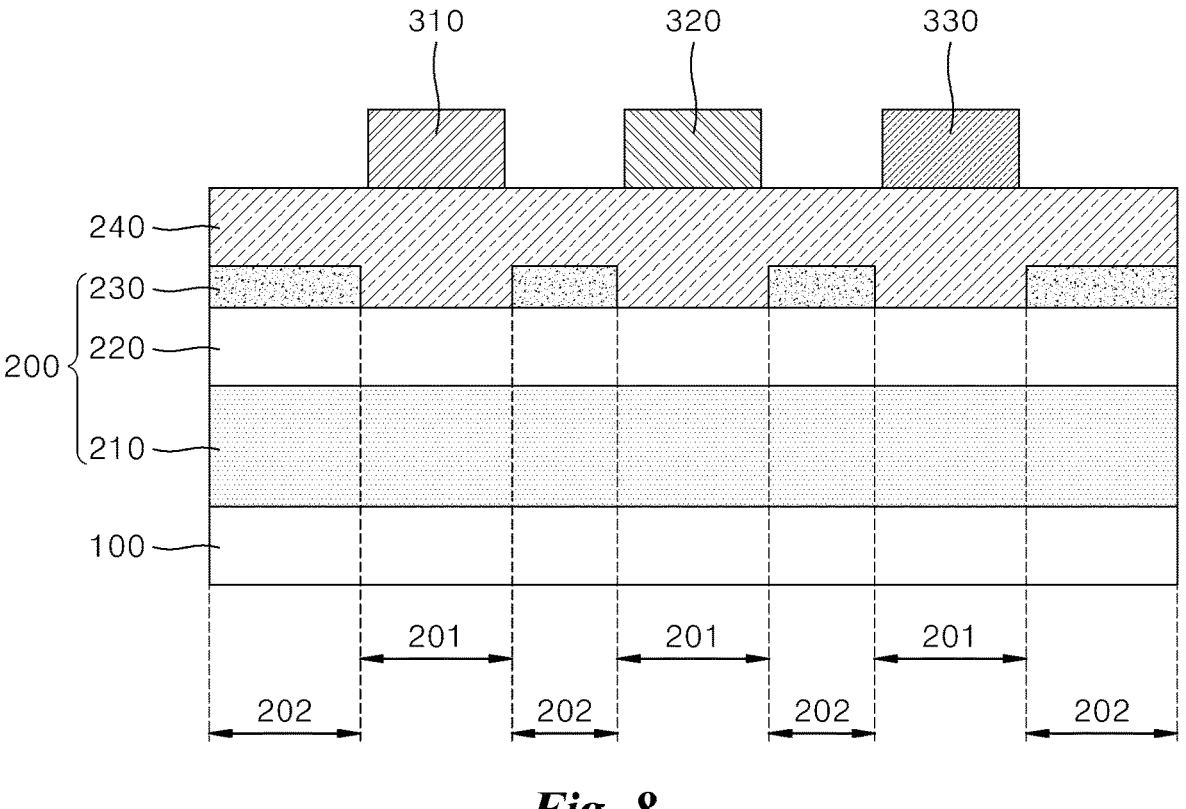
FIG. 8 is a cross-sectional view of a display device corresponding to one pixel according to a fourth embodiment of the present disclosure.
Figure 9:
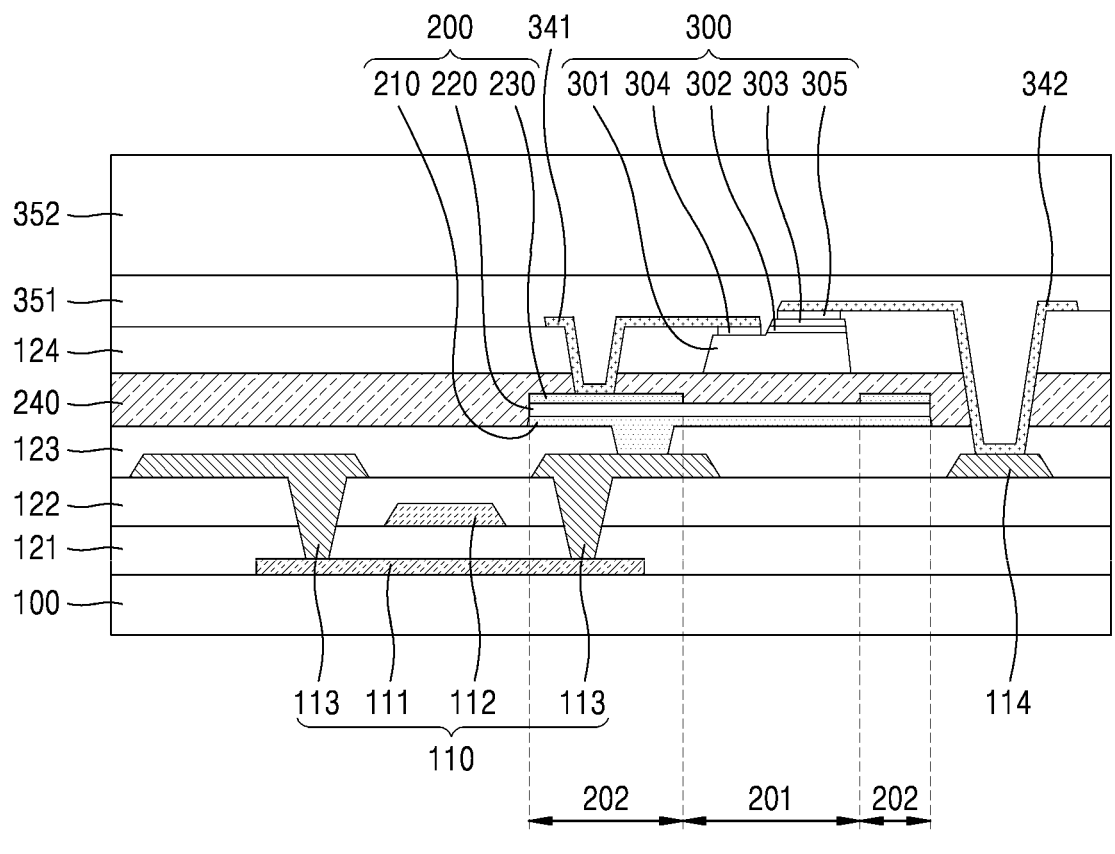
FIG. 9 is a cross-sectional view of a display device corresponding to one sub-pixel according to a third embodiment and a fourth embodiment of the present disclosure.

A third embodiment and a fourth embodiment may be described with referring to FIG. 7 to FIG. 9.

Referring to FIG. 7 to FIG. 9, the reflective plate 200 according to the third embodiment and the fourth embodiment may include the first reflective plate layer 210 and the second reflective plate layer 220 disposed so as to correspond to each of the first reflective area 201 and the second reflective area 202, and the third reflective plate layer 230 additionally disposed on the first reflective plate layer 210 and the second reflective plate layer 220 and disposed so as to correspond to the second reflective area 202.

As such, the reflective plate 200 may be composed of two layers in the first reflective area 201 and may be composed of three layers in the second reflective area 202.

Each of the first reflective plate layer 210 and the third reflective plate layer 230 may be a metal layer, while the second reflective plate layer may be a transparent layer.

That is, in the third embodiment and the fourth embodiment compared to the first embodiment, the second reflective plate layer 220 may be further disposed on the first reflective plate layer 210 and in an area corresponding to the first reflective area 201.

In the third embodiment corresponding to FIG. 7 and FIG. 9, the first reflective plate layer 210 and the third reflective plate layer 230 as metal layers may include the same metal.

For example, the first reflective plate layer 210 and the third reflective plate layer 230 may be made of the same material including aluminum (Al).

Accordingly, light reflectance of the first reflective plate layer 210 and light reflectance of the third reflective plate layer 230 may be equal to each other.

However, the light reflectance of the first reflective plate layer 210 and that of the third reflective plate layer 230 may be adjusted to be different from each other by adjusting the thickness of each of the first reflective plate layer 210 and the third reflective plate layer 230.

In the fourth embodiment corresponding to FIG. 8 and FIG. 9, the first reflective plate layer 210 and the third reflective plate layer 230 as the metal layers may include different metals.

In this case, the metal included in the third reflective plate layer 230 may have lower light reflectance than that of the metal included in the first reflective plate layer 210.

Accordingly, the third reflective plate layer 230 may have reflectance of light of a wavelength of 550 nm lower than that of the first reflective plate layer 210.

For example, the first reflective plate layer 210 may include aluminum (Al), and the third reflective plate layer 230 may include molybdenum (Mo). Thus, the first reflective plate layer 210 and the third reflective plate layer 230 as the metal layers may include different metals.

The aluminum (Al) may have a light reflectance of approximately 80% to 90%, while the molybdenum (Mo) may have a light reflectance of approximately 40% to 50%.

The area where the third reflective plate layer 230 is disposed corresponds to the low reflectance area. Thus, the third reflective plate layer 230 may include a metal with lower light reflectance than that of the metal being included in the first reflective plate layer 210. Thus, the difference between the reflectance of the first reflective area 201 and the reflectance of the second reflective area 202 may be greater.

Therefore, it is beneficial that the first reflective plate layer 210 includes a metal with a light reflectance of 60% or higher, and the third reflective plate layer 230 includes a metal with a light reflectance of 50% or lower, such that the difference between the light reflectance of the first reflective plate layer 210 and that of the third reflective plate layer 230 is about 10% or larger.

When, in this way, the difference between the light reflectance of the first reflective plate layer 210 and that of the third reflective plate layer 230 is about 10% or larger, the black reflection visibility may be further greatly improved.

Figure 10:
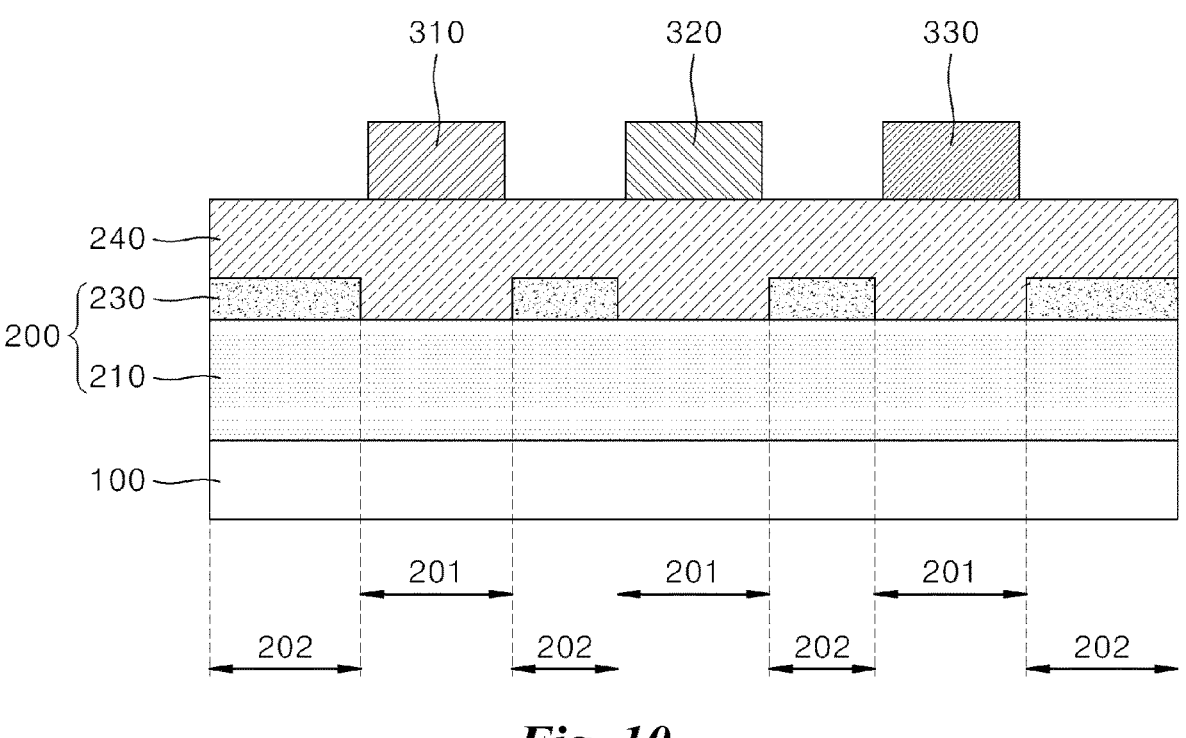
FIG. 10 is a cross-sectional view of a display device corresponding to one pixel according to a fifth embodiment of the present disclosure.
Figure 11:
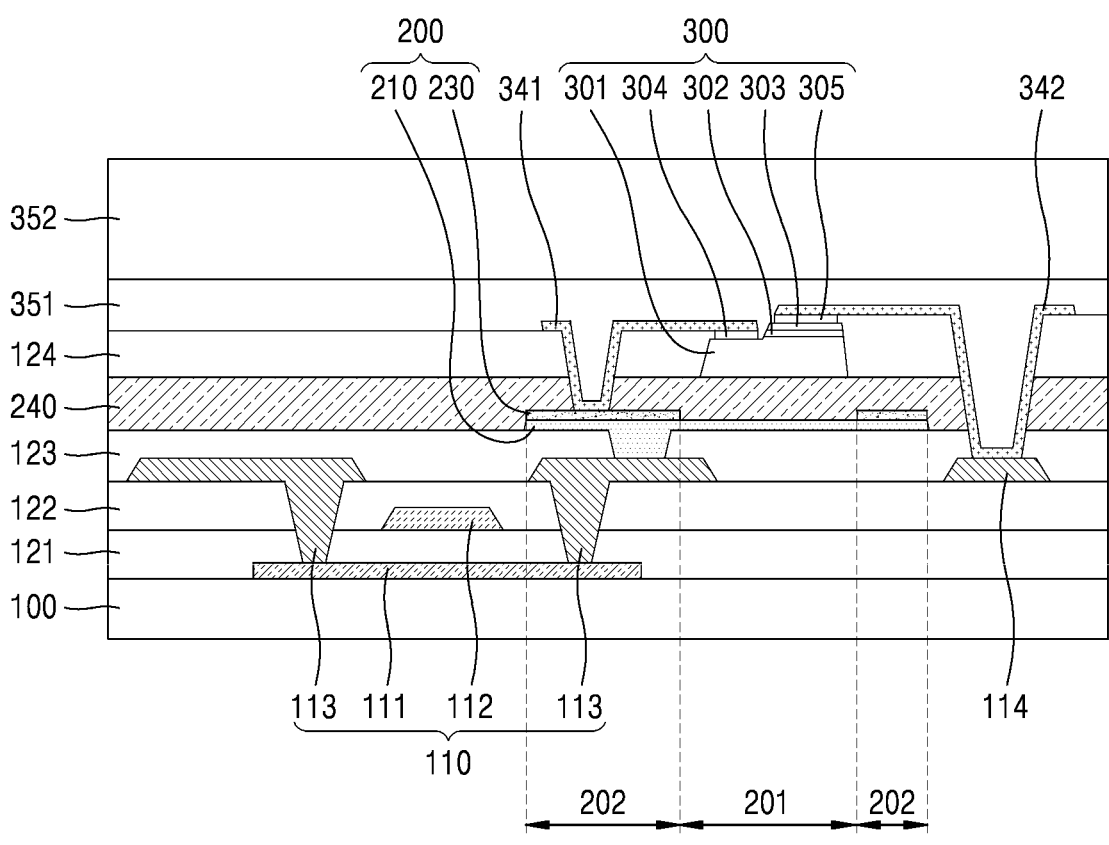
FIG. 11 is a cross-sectional view of a display device corresponding to one sub-pixel according to a fifth embodiment of the present disclosure.

A fifth embodiment may be described with referring to FIG. 10 and FIG. 11.

Referring to FIG. 10 and FIG. 11, the reflective plate 200 according to the fifth embodiment may include the first reflective plate layer 210 disposed so as to correspond to the first reflective area 201 and the second reflective area 202, and the third reflective plate layer 230 additionally disposed on the first reflective plate layer 210 and disposed so as to correspond to the second reflective area 202.

As such, the reflective plate 200 may be composed of one layer in the first reflective area 201 and may be composed of two layers in the second reflective area 202.

Each of the first reflective plate layer 210 and the third reflective plate layer 230 may be a metal layer.

That is, in the fifth embodiment, compared to the first embodiment, in the area corresponding to the second reflective area 202, the second reflective plate layer 220 may be absent on the first reflective plate layer 210 such that the third reflective plate layer 230 may be in direct contact with the first reflective plate layer 210.

In this case, the metal included in the third reflective plate layer 230 may have lower light reflectance than that of the metal included in the first reflective plate layer 210.

Accordingly, the third reflective plate layer 230 may have reflectance of light of a wavelength of 550 nm lower than that of the first reflective plate layer 210.

For example, the first reflective plate layer 210 may include aluminum (Al), and the third reflective plate layer 230 may include molybdenum (Mo). Thus, the first reflective plate layer 210 and the third reflective plate layer 230 may include different metals.

The aluminum (Al) may have a light reflectance of approximately 80% to 90%, while the molybdenum (Mo) may have a light reflectance of approximately 40% to 50%.

The area where the third reflective plate layer 230 is disposed corresponds to the low reflectance area. Thus, the third reflective plate layer 230 may include a metal with lower light reflectance than that of the metal being included in the first reflective plate layer 210. Thus, the difference between the reflectance of the first reflective area 201 and the reflectance of the second reflective area 202 may be greater.

Hereinafter, referring to FIG. 12 to FIG. 17, a display device according to a sixth embodiment of the present disclosure will be described.

Figure 12:
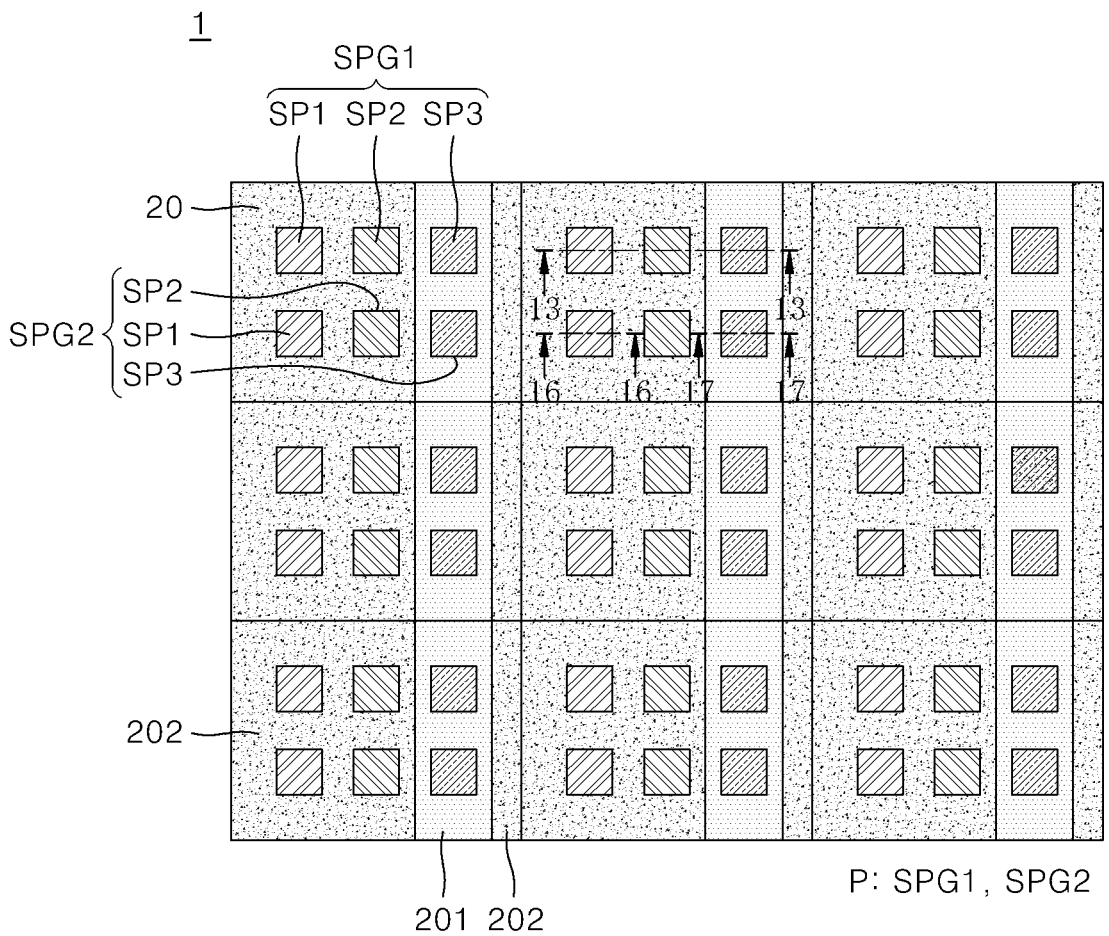
FIG. 12 is a plan view of a display device according to a sixth embodiment of the present disclosure.
Figure 13:
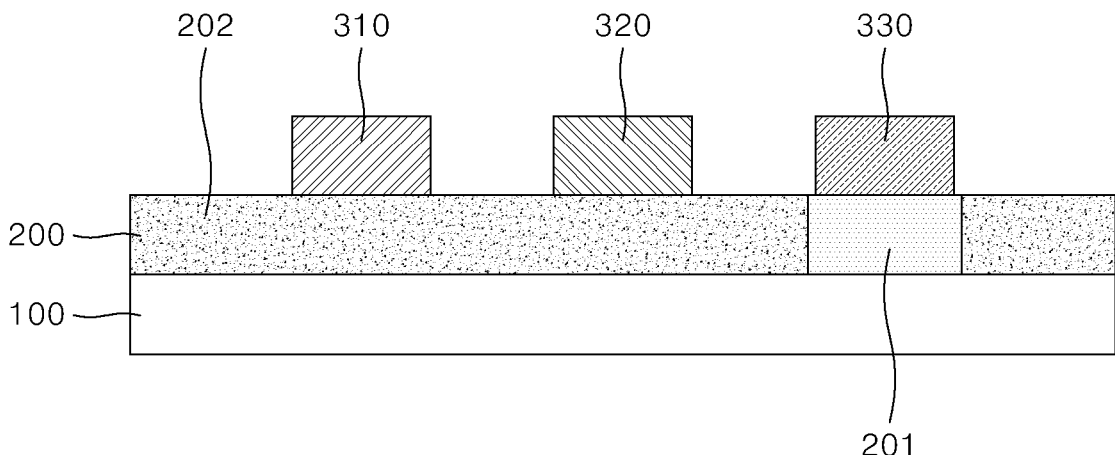
FIG. 13 is a cross-sectional view of a display device corresponding to one pixel according to a sixth embodiment of the present disclosure.
Figure 14:
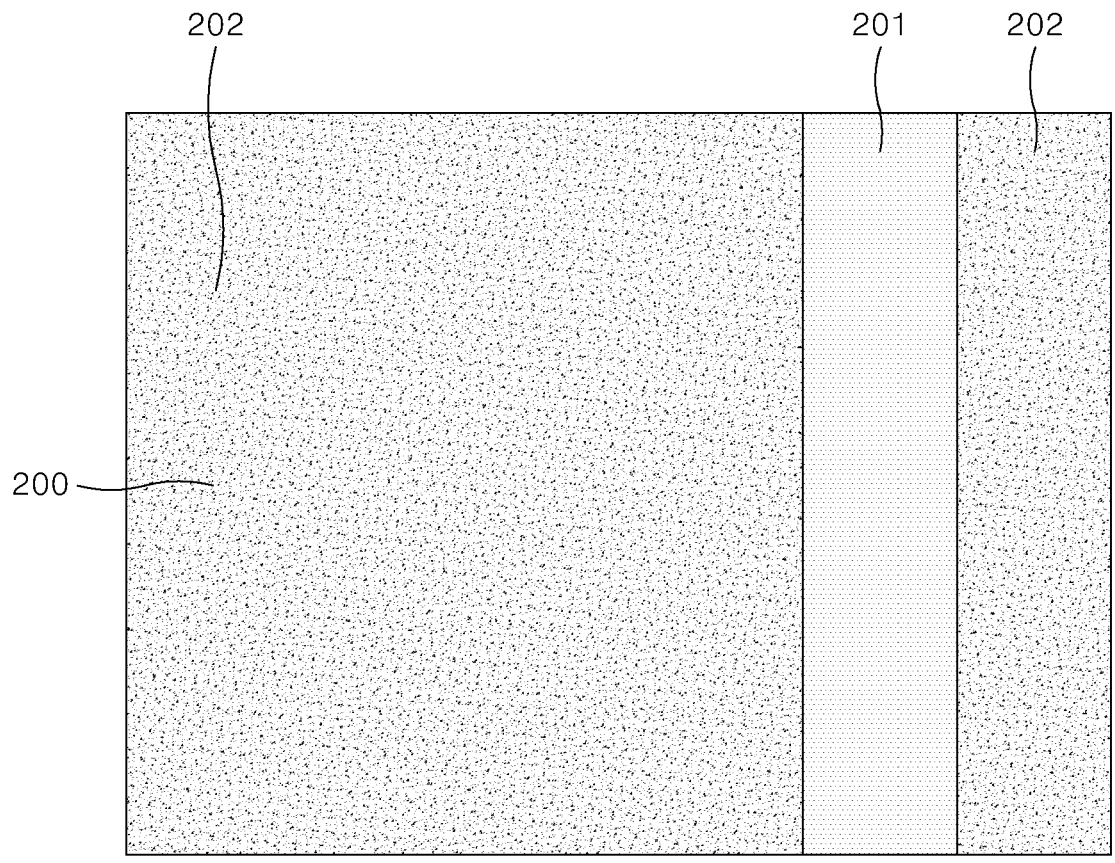
FIG. 14 is a plan view of a reflective plate corresponding to one pixel according to a sixth embodiment of the present disclosure.
Figure 15:
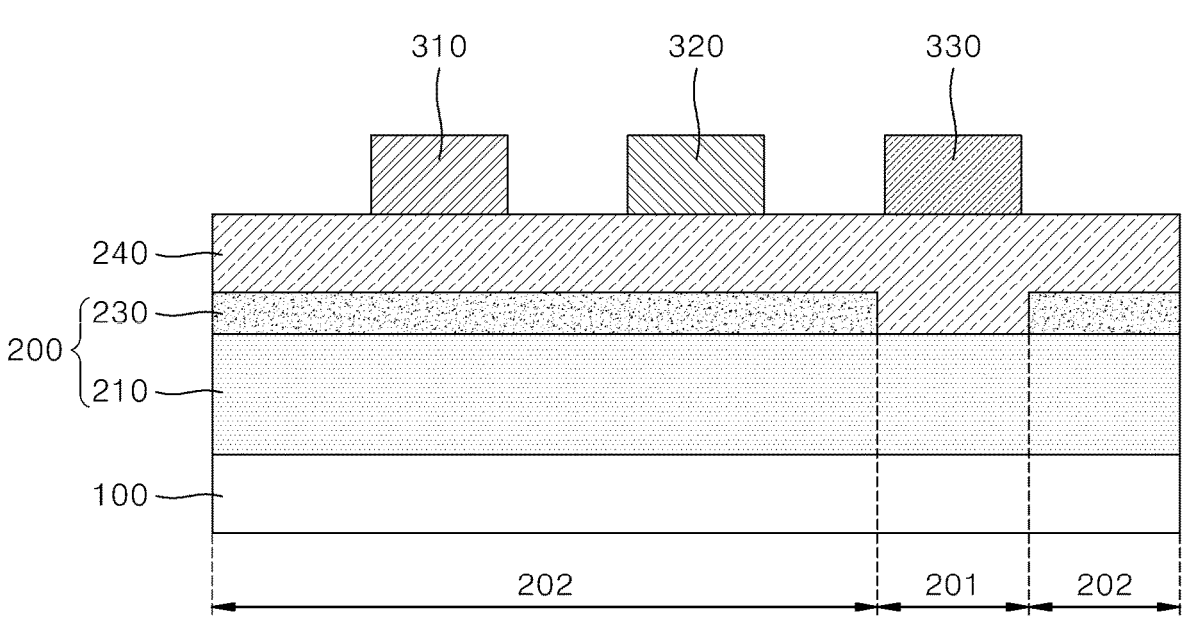
FIG. 15 is a cross-sectional view of a display device corresponding to one pixel according to a sixth embodiment of the present disclosure.

A cross-sectional view taken along a line 13-13 as shown in FIG. 12 corresponds to FIG. 13 to FIG. 15. A cross-sectional view taken along a line 16-16 as shown in FIG. 12 corresponds to FIG. 16. A cross-sectional view taken along a line 17-17 as shown in FIG. 12 corresponds to FIG. 17.

According to the sixth embodiment, in the unit display panel 20, each of the first sub-pixel group SPG1 and the second sub-pixel group SPG2 disposed on the substrate 100 may include the first sub-pixel SP1, the second sub-pixel SP2, and the third sub-pixel SP3.

A plurality of light-emitting elements 300 disposed on the substrate 100 may include the first color light-emitting element 310, the second color light-emitting element 320, and the third color light-emitting element 330.

In this case, the first color light-emitting element 310 may render a red color (R), the second color light-emitting element 320 may render a green color (G), and the third color light-emitting element 330 may render a blue color (B).

According to the sixth embodiment, some of the plurality of light-emitting elements 300 may be disposed so as to overlap the first reflective area 201, while the rest of the plurality of light-emitting elements 300 may be disposed so as to overlap the second reflective area 202.

For example, the first color light-emitting element 310 rendering the red color and the second color light-emitting element 320 rendering the green color may be disposed so as to overlap the second reflective area 202, while the third color light-emitting element 330 rendering the blue color may be disposed so as to overlap the first reflective area 201.

Therefore, as shown in FIG. 14, the reflective plate 200 according to the sixth embodiment may have a pattern in which the second reflective area 202 and the first reflective area 201 are distinguished from each other.

Specifically, in an area corresponding to the first sub-pixel SP1 and the second sub-pixel SP2, the second reflective area 202 having the low reflectance may be disposed, while in an area corresponding to the third sub-pixel SP3, the first reflective area 201 having the high reflectance may be disposed.

In addition, the second reflective area 202 may be disposed in an entirety of an area except for the area corresponding to the third sub-pixel SP3.

Accordingly, based on a total area size of the reflective plate 200, an area size corresponding to the second reflective area 202 may be larger than an area size corresponding to the first reflective area 201.

Referring to FIG. 15, the reflective plate 200 according to the sixth embodiment may include the first reflective plate layer 210 disposed so as to correspond to the first reflective area 201 and the second reflective area 202, and the third reflective plate layer 230 additionally disposed on the first reflective plate layer 210 and disposed so as to correspond to the second reflective area 202.

As such, the reflective plate 200 may be composed of one layer in the first reflective area 201 and may be composed of two layers in the second reflective area 202.

Each of the first reflective plate layer 210 and the third reflective plate layer 230 may be a metal layer.

In this case, the metal included in the third reflective plate layer 230 may have lower light reflectance than that of the metal included in the first reflective plate layer 210.

Accordingly, the third reflective plate layer 230 may have reflectance of light of a wavelength of 550 nm lower than that of the first reflective plate layer 210.

For example, the first reflective plate layer 210 may include aluminum (Al), and the third reflective plate layer 230 may include molybdenum (Mo). Thus, the first reflective plate layer 210 and the third reflective plate layer 230 may include different materials.

Figure 16:
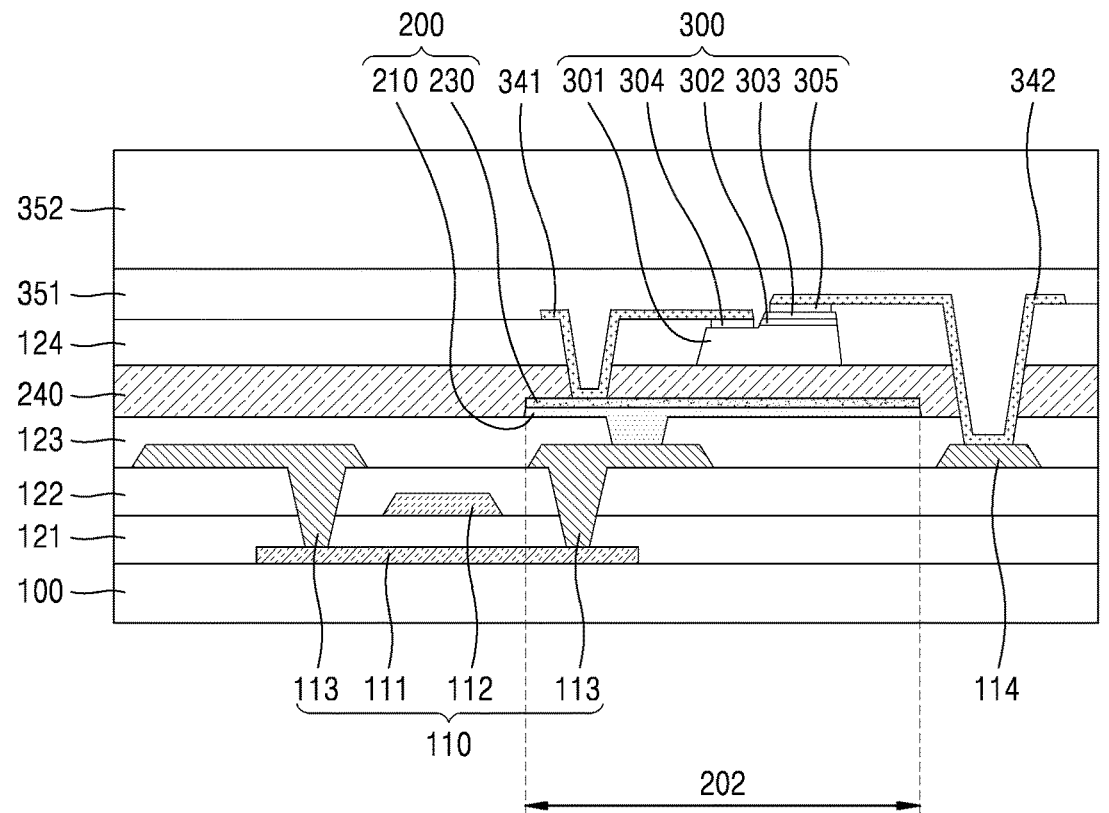
FIG. 16 is a cross-sectional view of a display device corresponding to one sub-pixel according to a sixth embodiment of the present disclosure.

Referring to FIG. 16, the first reflective plate layer 210 and the third reflective plate layer 230 may be stacked in the second reflective area 202 such that a portion of the reflective plate 200 disposed under the first color light-emitting element 310 or the second color light-emitting element 320 corresponds to the second reflective area 202 having the low light reflectance.

Figure 17:
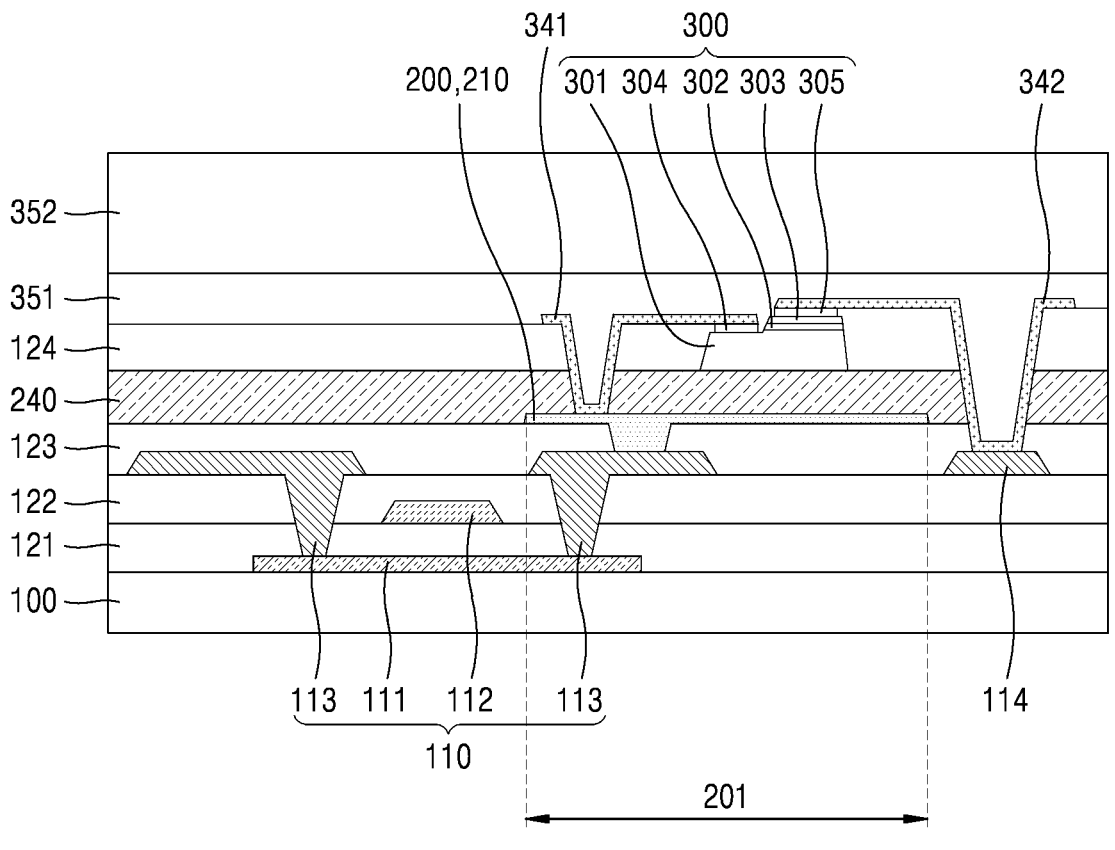
FIG. 17 is a cross-sectional view of a display device corresponding to another sub-pixel according to a sixth embodiment of the present disclosure.

To the contrary, referring to FIG. 17, only the first reflective plate layer 210 may be disposed in the first reflective area 201 such that a portion of the reflective plate 200 disposed under the third color light-emitting element 330 may correspond to the first reflective area 201 having the high light reflectance.

The third color light-emitting element 330 rendering the blue color may have higher light efficiency than that of each of the first color light-emitting element 310 rendering the red color and the second light-emitting element 320 rendering the green color.

Therefore, according to an embodiment of the present disclosure, among a plurality of sub-pixels rendering different colors, a sub-pixel with high light efficiency may be disposed so as to correspond to the low reflectance area of the reflective plate, and a sub-pixel with low light efficiency may be disposed so as to correspond to the high reflectance area of the reflective plate. Thus, when the display device includes the plurality of sub-pixels having different light efficiencies, the light efficiency and the light reflectance may be optimized.

In this way, the difference between the light efficiencies of the light-emitting elements having different light efficiencies may be reduced due to the above-described arrangement structure of the low reflectance area and the high reflectance area of the reflective plate 200.

A display panel and a display device according to an embodiment of the present disclosure as described above may be described as follows.

A first aspect of the present disclosure provides a display panel comprising: a substrate; a reflective plate disposed on the substrate; and a light-emitting element disposed on the reflective plate, wherein the reflective plate includes a first reflective area and a second reflective area, wherein the first reflective area has a reflectance of light of a wavelength of 550 nm greater than a reflectance of light of a wavelength of 550 nm of the second reflective area, wherein at least a partial area of the light-emitting element overlaps the first reflective area.

In one implementation of the first aspect, the second reflective area has a larger area size than an area size of the first reflective area.

In one implementation of the first aspect, the first reflective area includes a plurality of first reflective areas, wherein adjacent first reflective areas are spaced apart from each other.

In one implementation of the first aspect, the reflective plate includes: a first reflective plate layer disposed so as to correspond to the first reflective area and the second reflective area; and a second reflective plate layer and a third reflective plate layer disposed so as to correspond to the second reflective area and sequentially stacked on the first reflective plate layer, wherein each of the first reflective plate layer and the third reflective plate layer is a metal layer, wherein the second reflective plate layer is a transparent layer.

In one implementation of the first aspect, the second reflective plate layer is further disposed so as correspond to the first reflective area and disposed on the first reflective plate layer.

In one implementation of the first aspect, the first reflective plate layer and the third reflective plate layer include the same metal.

In one implementation of the first aspect, the third reflective plate layer has a reflectance of light of a wavelength of 550 nm lower than a reflectance of light of a wavelength of 550 nm of the first reflective plate layer.

In one implementation of the first aspect, a thickness of the third reflective plate layer is smaller than a thickness of the first reflective plate layer.

In one implementation of the first aspect, the reflective plate includes: a first reflective plate layer disposed so as to correspond to the first reflective area and the second reflective area; and a third reflective plate layer disposed on the first reflective plate layer and disposed so as to correspond to the second reflective area, wherein each of the first reflective plate layer and the third reflective plate layer is a metal layer, wherein the third reflective plate layer has a reflectance of light of a wavelength of 550 nm lower than a reflectance of light of a wavelength of 550 nm of the first reflective plate layer.

In one implementation of the first aspect, the metal layer includes at least one selected from a group consisting of aluminum (Al), silver (Ag), molybdenum (Mo), titanium (Ti), and an alloy of at least two thereof.

In one implementation of the first aspect, the transparent layer is a conductive oxide layer or a transparent insulating layer.

A second aspect of the present disclosure provides a display panel comprising: a substrate; a reflective plate disposed on the substrate; and a plurality of light-emitting elements disposed on the reflective plate, wherein the reflective plate includes a first reflective area and a second reflective area, wherein the first reflective area has a reflectance of light of a wavelength of 550 nm greater than a reflectance of light of a wavelength of 550 nm of the second reflective area, wherein some of the plurality of light-emitting elements are disposed so as to overlap the first reflective area, while the others of the plurality of light-emitting elements are disposed so as to overlap the second reflective area.

In one implementation of the second aspect, the plurality of light-emitting elements include a first color light-emitting element, a second color light-emitting element, and a third color light-emitting element, wherein the first color light-emitting element and the second color light-emitting element are disposed so as to overlap the second reflective area, wherein the third color light-emitting element is disposed so as to overlap the first reflective area.

In one implementation of the second aspect, wherein the first color light-emitting element renders a red color, wherein the second color light-emitting element renders a green color, wherein the third color light-emitting element renders a blue color.

A third aspect of the present disclosure provides a display device comprising: a substrate; a thin-film transistor including a pair of source and drain electrodes; a reflective plate electrically connected to one of the source and drain electrodes; a light-emitting element disposed on the reflective plate; and a connection electrode electrically connecting the reflective plate and the light-emitting element to each other, wherein the reflective plate includes a first reflective area and a second reflective area, wherein the first reflective area has a reflectance of light of a wavelength of 550 nm greater than a reflectance of light of a wavelength of 550 nm of the second reflective area, wherein at least a partial area of the light-emitting element overlaps the first reflective area.

In one implementation of the third aspect, the reflective plate includes: a first reflective plate layer disposed so as to correspond to the first reflective area and the second reflective area; and a second reflective plate layer and a third reflective plate layer disposed so as to correspond to the second reflective area and sequentially stacked on the first reflective plate layer, wherein each of the first reflective plate layer and the third reflective plate layer is a metal layer, wherein the second reflective plate layer is a transparent layer.

In one implementation of the third aspect, the reflective plate includes: a first reflective plate layer disposed so as to correspond to the first reflective area and the second reflective area; and a third reflective plate layer disposed on the first reflective plate layer and disposed so as to correspond to the second reflective area, wherein each of the first reflective plate layer and the third reflective plate layer is a metal layer, wherein the third reflective plate layer has a reflectance of light of a wavelength of 550 nm lower than a reflectance of light of a wavelength of 550 nm of the first reflective plate layer.

A fourth aspect of the present disclosure provides a display device comprising: a substrate; a thin-film transistor including a pair of source and drain electrodes; a reflective plate electrically connected to one of the source and drain electrodes; a plurality of light-emitting elements disposed on the reflective plate; and a connection electrode electrically connecting the reflective plate and the light-emitting element to each other, wherein the reflective plate includes a first reflective area and a second reflective area, wherein the first reflective area has a reflectance of light of a wavelength of 550 nm greater than a reflectance of light of a wavelength of 550 nm of the second reflective area, wherein some of the plurality of light-emitting elements are disposed so as to overlap the first reflective area, while the others of the plurality of light-emitting elements are disposed so as to overlap the second reflective area.

In one implementation of the fourth aspect, the plurality of light-emitting elements include a first color light-emitting element, a second color light-emitting element, and a third color light-emitting element, wherein the first color light-emitting element and the second color light-emitting element are disposed so as to overlap the second reflective area, wherein the third color light-emitting element is disposed so as to overlap the first reflective area.

In one implementation of the fourth aspect, the first color light-emitting element renders a red color, wherein the second color light-emitting element renders a green color, wherein the third color light-emitting element renders a blue color.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel comprising:
   a substrate;
   a reflective plate disposed on the substrate; and
   a light-emitting element disposed on the reflective plate,
      wherein the reflective plate includes a first reflective area and a second reflective area,
      wherein the first reflective area has a reflectance of light of a wavelength of 550 nm greater than a reflectance of light of a wavelength of 550 nm of the second reflective area, and
      wherein at least a partial area of the light-emitting element overlaps the first reflective area.

2. The display panel of claim 1, wherein the second reflective area has a larger area size than an area size of the first reflective area.

3. The display panel of claim 1, wherein the first reflective area includes a plurality of first reflective areas, and
   wherein adjacent first reflective areas are spaced apart from each other.

4. The display panel of claim 1, wherein the reflective plate includes:
   a first reflective plate layer disposed to correspond to the first reflective area and the second reflective area; and
   a third reflective plate layer disposed on the first reflective plate layer and disposed to correspond to the second reflective area,
      wherein each of the first reflective plate layer and the third reflective plate layer is a metal layer, and
      wherein the third reflective plate layer has a reflectance of light of a wavelength of 550 nm lower than a reflectance of light of a wavelength of 550 nm of the first reflective plate layer.

5. The display panel of claim 1, wherein the reflective plate includes:
   a first reflective plate layer disposed to correspond to the first reflective area and the second reflective area; and
   a second reflective plate layer and a third reflective plate layer disposed to correspond to the second reflective area and sequentially stacked on the first reflective plate layer,
      wherein each of the first reflective plate layer and the third reflective plate layer is a metal layer, and
      wherein the second reflective plate layer is a transparent layer.

6. The display panel of claim 5, wherein the second reflective plate layer is further disposed to correspond to the first reflective area and disposed on the first reflective plate layer.

7. The display panel of claim 5, wherein the first reflective plate layer and the third reflective plate layer include a same metal.

8. The display panel of claim 5, wherein the third reflective plate layer has a reflectance of light of a wavelength of 550 nm lower than a reflectance of light of a wavelength of 550 nm of the first reflective plate layer.

9. The display panel of claim 5, wherein a thickness of the third reflective plate layer is smaller than a thickness of the first reflective plate layer.

10. The display panel of claim 5, wherein the metal layer includes at least one selected from a group consisting of aluminum (Al), silver (Ag), molybdenum (Mo), titanium (Ti), and an alloy of at least two thereof.

11. The display panel of claim 5, wherein the transparent layer is a conductive oxide layer or a transparent insulating layer.

12. A display panel comprising:

a substrate;

a reflective plate disposed on the substrate; and a plurality of light-emitting elements disposed on the reflective plate, wherein the reflective plate includes a first reflective area and a second reflective area, wherein the first reflective area has a reflectance of light of a wavelength of 550 nm greater than a reflectance of light of a wavelength of 550 nm of the second reflective area, and wherein some of the plurality of light-emitting elements are disposed to overlap the first reflective area, while the others of the plurality of light-emitting elements are disposed to overlap the second reflective area.

13. The display panel of claim 12, wherein the plurality of light-emitting elements include a first color light-emitting element, a second color light-emitting element, and a third color light-emitting element, wherein the first color light-emitting element and the second color light-emitting element are disposed to overlap the second reflective area, and wherein the third color light-emitting element is disposed to overlap the first reflective area.

14. The display panel of claim 13, wherein the first color light-emitting element renders a red color, wherein the second color light-emitting element renders a green color, and wherein the third color light-emitting element renders a blue color.

15. A display device comprising:

a substrate;

a thin-film transistor including source and drain electrodes;

a reflective plate electrically connected to one of the source and drain electrodes;

a light-emitting element disposed on the reflective plate; and a connection electrode electrically connecting the reflective plate and the light-emitting element to each other, wherein the reflective plate includes a first reflective area and a second reflective area, wherein the first reflective area has a reflectance of light of a wavelength of 550 nm greater than a reflectance of light of a wavelength of 550 nm of the second reflective area, and wherein at least a partial area of the light-emitting element overlaps the first reflective area.

16. The display device of claim 15, wherein the reflective plate includes:

a first reflective plate layer disposed to correspond to the first reflective area and the second reflective area; and a second reflective plate layer and a third reflective plate layer disposed to correspond to the second reflective area and sequentially stacked on the first reflective plate layer, wherein each of the first reflective plate layer and the third reflective plate layer is a metal layer, and wherein the second reflective plate layer is a transparent layer.

17. The display device of claim 15, wherein the reflective plate includes:

a first reflective plate layer disposed to correspond to the first reflective area and the second reflective area; and a third reflective plate layer disposed on the first reflective plate layer and disposed to correspond to the second reflective area, wherein each of the first reflective plate layer and the third reflective plate layer is a metal layer, and wherein the third reflective plate layer has a reflectance of light of a wavelength of 550 nm lower than a reflectance of light of a wavelength of 550 nm of the first reflective plate layer.

18. A display device comprising:

a substrate;

a thin-film transistor including source and drain electrodes;

a reflective plate electrically connected to one of the source and drain electrodes;

a plurality of light-emitting elements disposed on the reflective plate; and a connection electrode electrically connecting the reflective plate and the light-emitting element to each other, wherein the reflective plate includes a first reflective area and a second reflective area, wherein the first reflective area has a reflectance of light of a wavelength of 550 nm greater than a reflectance of light of a wavelength of 550 nm of the second reflective area, and wherein some of the plurality of light-emitting elements are disposed to overlap the first reflective area, while the others of the plurality of light-emitting elements are disposed to overlap the second reflective area.

19. The display device of claim 18, wherein the plurality of light-emitting elements include a first color light-emitting element, a second color light-emitting element, and a third color light-emitting element, wherein the first color light-emitting element and the second color light-emitting element are disposed to overlap the second reflective area, and wherein the third color light-emitting element is disposed to overlap the first reflective area.

20. The display device of claim 18, wherein the first color light-emitting element renders a red color, wherein the second color light-emitting element renders a green color, and wherein the third color light-emitting element renders a blue color.

\* \* \* \* \*